(12) United States Patent
Han (10) Patent No.: US 11,652,169 B2
(45) Date of Patent: May 16, 2023

(54) SEMICONDUCTOR DEVICE AND MANUFACTURING METHOD THEREOF

(71) Applicant: Joulwatt Technology Co., Ltd., Hangzhou (CN)

(72) Inventor: Guangtao Han, Hangzhou (CN)

(73) Assignee: JOULWATT TECHNOLOGY CO., LTD., Hangzhou (CN)

( * ) Notice: Subject to any disclaimer, the term of this patent is extended or adjusted under 35 U.S.C. 154(b) by 55 days.

(21) Appl. No.: 17/315,351

(22) Filed: May 9, 2021

(65) Prior Publication Data

US 2021/0351295 A1 Nov. 11, 2021

(30) Foreign Application Priority Data

May 9, 2020 (CN) .......................... 202010386724.X (51) Int. Cl.

| | | |
|---|---|---|
| *H01L 29/78* | (2006.01) | |
| *H01L 21/02* | (2006.01) | |
| *H01L 21/265* | (2006.01) | |
| *H01L 21/311* | (2006.01) | |
| *H01L 29/08* | (2006.01) | |
| *H01L 29/10* | (2006.01) | |
| *H01L 29/66* | (2006.01) | |

(52) U.S. Cl.
CPC .... *H01L 29/7816* (2013.01); *H01L 21/02236* (2013.01); *H01L 21/02255* (2013.01); *H01L 21/26513* (2013.01); *H01L 21/31111* (2013.01); *H01L 21/31144* (2013.01); *H01L 29/0869* (2013.01); *H01L 29/0886* (2013.01); *H01L 29/1095* (2013.01); *H01L 29/66681* (2013.01)

(58) Field of Classification Search
CPC ........... H01L 29/7816; H01L 21/02236; H01L 21/02255; H01L 21/26513; H01L 21/31111; H01L 21/31144; H01L 29/0869; H01L 29/0886; H01L 29/1095; H01L 29/66681; H01L 29/66613; H01L 29/1037; H01L 29/78; H01L 29/0603; H01L 29/0684; H01L 29/1033
See application file for complete search history.

(56) References Cited

U.S. PATENT DOCUMENTS

| | | | | |
|---|---|---|---|---|
| 5,879,978 A | * | 3/1999 | Ra ........................... | H01L 29/78 257/E29.13 |
| 7,825,438 B2 | * | 11/2010 | Jung ................. | H01L 27/14609 257/E21.429 |
| 2004/0222464 A1 | | 11/2004 | Shimada | |

* cited by examiner

*Primary Examiner* — Mohammed R Alam
(74) *Attorney, Agent, or Firm* — Treasure IP Group, LLC (57) ABSTRACT

Disclosed is a semiconductor device and a manufacturing method, comprising: forming a pad oxide layer and a silicon nitride layer on a substrate; etching the silicon nitride layer into a plurality of segments; forming an oxide layer, having an up-and-down wave shape, by performing a traditional thermal growth field oxygen method on the semiconductor device by use of the plurality of segments serving as forming-assisted structures; performing traditional processes on the semiconductor device having an up-and-down wavy semiconductor surface, to form a gate oxide layer, a polysilicon layer, and to form a source region and a drain region by implantation The semiconductor device having an up-and-down wavy channel region may be formed by a traditional thermal growth field oxygen method, thus the manufacturing processes are simple, the cost is low, and the completed device may have a larger effective channel width and a lower on-state resistance.

8 Claims, 5 Drawing Sheets

SEMICONDUCTOR DEVICE AND MANUFACTURING METHOD THEREOF

CROSS-REFERENCE TO RELATED APPLICATIONS

The present application claims the priority of Chinese Patent Application No. 202010386724.X, filed on May 9, 2020 and entitled by "SEMICONDUCTOR DEVICE AND MANUFACTURING METHOD THEREOF", which is incorporated herein by reference in its entirety.

FIELD OF TECHNOLOGY

The present disclosure relates to a technical field of semiconductor, in particular to a semiconductor device and a manufacturing method of the semiconductor device.

BACKGROUND

With a wide use of a laterally-diffused metal oxide semiconductor (LDMOS) in field of integrated circuits, performance requirements on the LDMOS are becoming higher and higher. In general, a method for reducing an on-state resistance of an LDMOS, is usually to increase a concentration of a drift region, and at the same time, to make it able to be completely depleted based on various theories about reduced surface field (RESURF), so that the on-state resistance can be low and a breakdown voltage can be maintained at a very high level. Moreover, by increasing an effective width of a channel of the LDMOS, a current carrying capacity can be improved, and thus the on-state resistance can also be reduced.

A traditional method for improving the effective width of the channel, is to use a three-dimensional grooved-gate structure, which is similar to a fin field-effect transistor (Fin-FET). However, such method has a high requirement on manufacturing processes, it is hard to realize the manufacturing processes and the cost is high.

SUMMARY OF THE INVENTION

In view of the existing status, an objective of the present disclosure is to provide a semiconductor device and a manufacturing method of a semiconductor device, which has a high performance and can be obtained by simple manufacturing processes with low cost.

According to a first aspect of the present disclosure, provided is a semiconductor device, wherein the semiconductor device comprises: a substrate; a first-type semiconductor layer which is stacked on the substrate and comprises a channel region extending on an upper surface of the first-type semiconductor layer; a second-type doped region, which has a doping type opposite to that of the first-type semiconductor layer and at least comprises a first second-type doped region and a second second-type doped region separated with the first second-type doped region by the channel region of the first-type semiconductor layer; and a gate structure located on the channel region of the first-type semiconductor layer, wherein the channel region of the first-type semiconductor layer has an up-and-down wave shape extending along a width direction of the channel region.

In an alternative embodiment, wherein the second-type doped region has an up-and-down wave shape, which is matched with the channel region of the first-type semiconductor layer.

According to a second aspect of the present disclosure, provided is a manufacturing method of a semiconductor device, wherein the manufacturing method comprises: successively forming a pad oxide layer and a silicon nitride layer on a substrate, which comprises a first-type semiconductor layer serving as a well region; etching the silicon nitride layer by using a photolithography mask layer as a mask to separate the silicon nitride layer into a plurality of segments, wherein a distribution direction of the plurality of segments of the silicon nitride layer is consistent with a width direction of a channel region of the semiconductor device; forming an oxide layer on the semiconductor device, which is obtained after the silicon nitride layer is etched, by using a thermal growth field oxygen process, and removing the silicon nitride layer and the oxide layer; forming a gate structure on the first-type semiconductor layer, after the photolithography mask layer, the oxide layer, and the silicon nitride layer are removed, wherein the gate structure comprises a gate oxide layer and a polysilicon layer; forming a second-type doped region on the semiconductor device, and forming the channel region in the first-type semiconductor layer, wherein the second-type doped region is at least separated into a first second-type doped region and a second second-type doped region by the channel region.

In an alternative embodiment, the plurality of segments of the silicon nitride layer are only distributed on a portion of the first-type semiconductor layer, and the portion is matched with the channel region. The location of the portion corresponds to the location of the channel region.

In an alternative embodiment, the plurality of segments of the silicon nitride layer are uniformly distributed.

In an alternative embodiment, wherein a size of each of the plurality of segments of the silicon nitride layer is adjustable, so as to make a wavelength and a peak-valley difference of a corresponding wave structure of the first-type semiconductor layer adjustable.

In an alternative embodiment, interval distances among the plurality of segments of the silicon nitride layer are adjustable, so as to make a wavelength and a peak-valley difference of a corresponding wave structure of the first-type semiconductor layer adjustable.

In an alternative embodiment, a thickness of the pad oxide layer is adjustable, so as to make a wavelength and a peak-valley difference of a corresponding wave structure of the first-type semiconductor layer adjustable.

In an alternative embodiment, a well region is formed by implanting doping impurity into the first-type semiconductor layer, after the photolithography mask layer, the oxide layer, and the silicon nitride layer are removed.

In an alternative embodiment, wherein before successively forming the pad oxide layer and the silicon nitride layer on the substrate, the method further comprises: forming a well region by implanting doping impurity into the first-type semiconductor layer.

In the semiconductor device and the manufacturing method of the semiconductor device according to embodiments of the present disclosure, the channel region of the first-type semiconductor layer, serving as a well region, has an up-and-down wave shape extending along a width direction of the channel region, so that the channel region of the first-type semiconductor device possesses an longer effective width under a certain straight width of the channel region, that is, an effective width of a source-drain-gate structure is much larger, thus an on-state resistance of the semiconductor device which has a certain overall size is much smaller than a conventional semiconductor device, and a current carrying capacity is improved.

In some embodiments, it can be independently selected whether the channel region and/or the second-type doped region should be manufactured as an up-and-down wave shape or not, in order to meet requirements of different semiconductor devices accordingly.

In some embodiments, the plurality of segments of the silicon nitride layer is grown on the first-type semiconductor layer. Then, the up-and-down wavy oxide layer is grown on the first-type semiconductor layer by use of a traditional thermal growth field oxygen method, thus the up-and-down wavy silicon surface can be formed. The up-and-down wavy structure thusly can be formed with a low process cost by simple and effective manufacturing processes, to improve the width of the channel region and the current carrying capacity of the semiconductor device.

In some embodiments, wavelengths and peak-valley differences of the plurality of up-and-down wave structures can be adjusted by adjusting the thickness of the pad oxide layer, the length and the thickness of each of the plurality of segments as well as the interval distances between the plurality of segments of the silicon nitride layer, so as to improve the product applicability.

BRIEF DESCRIPTION OF THE DRAWINGS

The above and other purposes, features and advantages of the present invention will become more apparent from the description below with reference to the accompanying drawings. Wherein.

DESCRIPTION OF THE EMBODIMENTS

Various embodiments of the present invention will be described in more detail below with reference to the accompanying drawings. In the various figures, the same elements are denoted by the same or similar reference numerals. For the sake of clarity, the various parts in the figures are not drawn to scale. In addition, some public information may not be disclosed. For the sake of brevity, the semiconductor structure obtained after several steps can be described in one accompanying drawing.

When describing the structure of a device, if a layer or a region is referred to as "on" or "above" another layer or another region, it can mean that the layer or the region is located directly on the another layer or the another region, or there are other layers or other regions between the layer or the region and the another layer or the another region. Moreover, if the device is flipped, the layer or the region will be "beneath" or "below" the another layer or the another region.

In order to describe the situation in which the layer or the region is directly located on the another layer or the another region, the present disclosure will adopt the expression of "A is directly located on B" or "A is on and adjacent to B". In the present disclosure, "A is directly located in B" means that A is located in B and A is directly adjacent to B, rather than A is located in the doping region formed in B.

In order to better understand technical solutions of the present disclosure, many specific details, such as structure, materials, dimensions, treatment processes and techniques of semiconductor devices, are described below. However, a person skilled in the art should understand that the present disclosure can still be implemented without certain specific details.

Unless specifically noted below, the layers or the regions of the semiconductor devices may be composed of material well known to those skilled in the art. Semiconductor materials include III-V semiconductors, such as GaAs, InP, Gan, and SiC, and IV semiconductors, such as Si, and Ge. Gate conductor and electrode layer may be formed form various conductive materials, such as metal layer, doped polysilicon layer, stacked gate conductor including the metal layer, the doped polysilicon layer, and other conductive materials, such as TaC, TiN, TaSiN, HfSiN, TiSiN, TiCN, TaAlC, TiAlN, TaN, PtSix, $Ni_3Si$, Pt, Ru, W, and a combination of the various conductive materials. Gate dielectric may consist of $SiO_2$ or materials with a dielectric constant greater than $SiO_2$, such as oxides, nitrides, oxynitrides, silicates, aluminates, and titanates. Moreover, the gate dielectric can be formed not only from materials known to the skilled in the art, but also materials developed in the future for the gate dielectric.

In the present disclosure, the term "semiconductor structure" refers to the entire semiconductor structure formed during each step of the fabrication procedure of a semiconductor device, including all layers or regions that have been formed. The term "lateral extension" refers to the extension along a direction roughly perpendicular to the depth of the trench.

The specific embodiments of the present disclosure are further described in detail referring to the accompanying drawings and the embodiments below.

Figure 1:
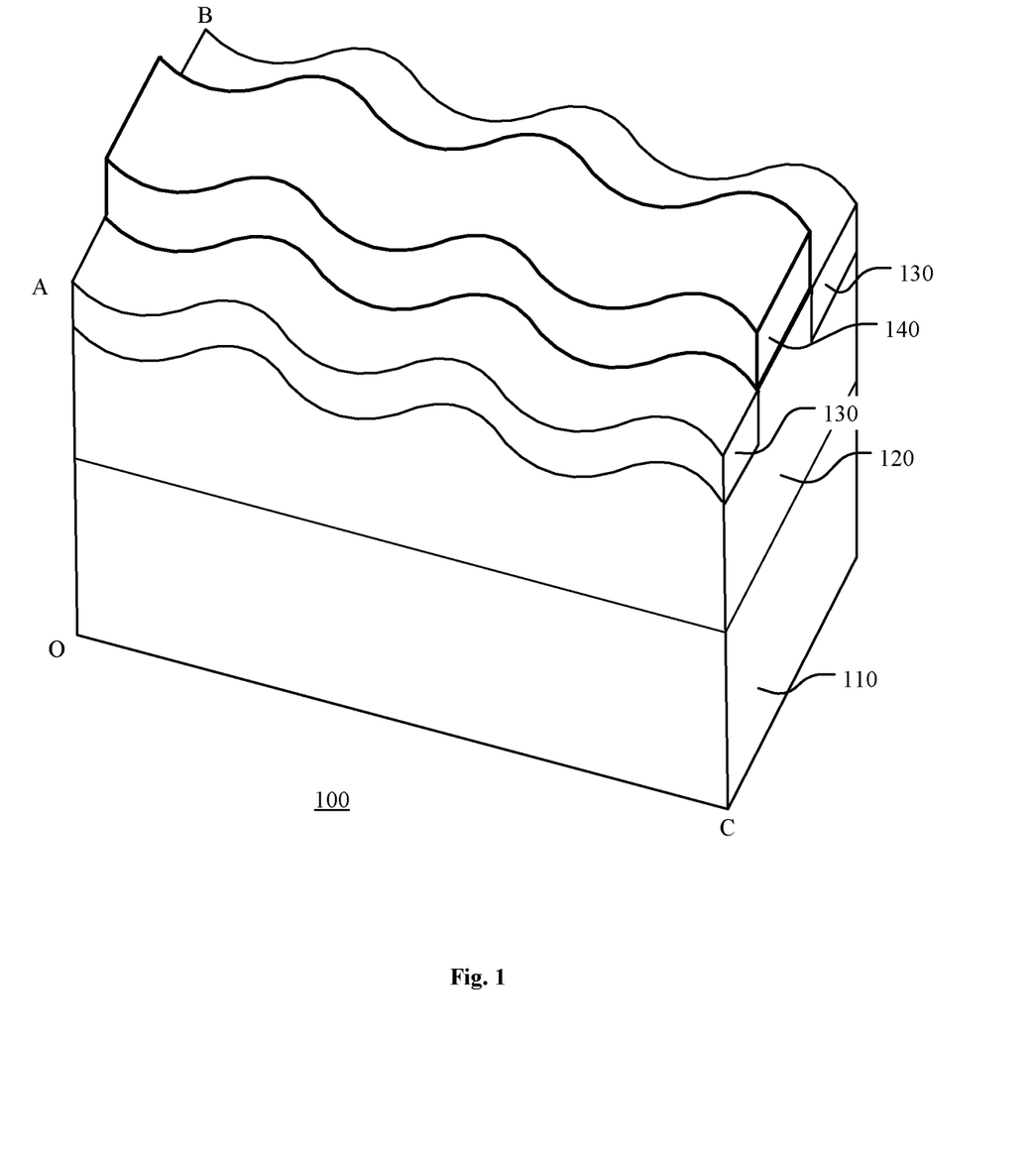
FIG. 1 shows a three-dimensional structural schematic view of a semiconductor device according to an embodiment of the present disclosure.

FIG. 1 shows a three-dimensional structural schematic view of a semiconductor device according to an embodiment of the present disclosure.

As shown in FIG. 1, the semiconductor device 100 comprises a substrate 110, such as a silicon substrate, a first-type semiconductor layer 120, a second-type doped region 130, and a gate structure 140. The second-type doped region 130 and the gate structure 140 each have an up-and-down wave shape. The doping type of the first-type semiconductor layer 120 is opposite to the doping type of the second-type doped region 130. In this embodiment, as an example, the semiconductor device 100 is an N-type metal oxide semiconductor (NMOS) device, of which the first-type semiconductor layer 120 is a P-type well region, and the second-type doped region 130 is an N-type doped region.

Figure 2:
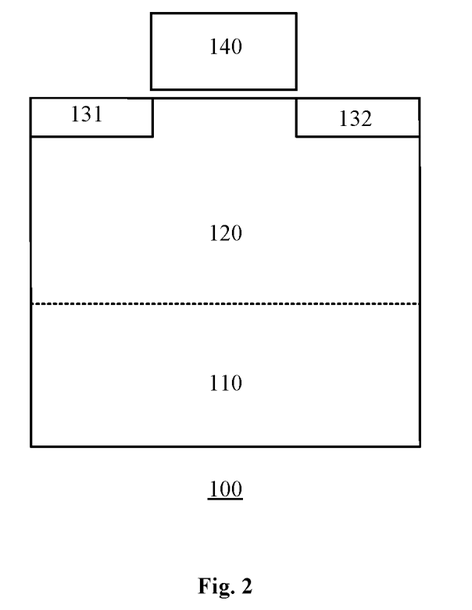
FIG. 2 shows a structural schematic view of a first vertical section of the semiconductor device shown in FIG. 1 according to an embodiment of the present disclosure.

FIG. 2 shows a structural schematic view of a first vertical section of the semiconductor device shown in FIG. 1 according to an embodiment of the present disclosure. It should be noted that the first vertical section corresponds to O-A-B plane shown in FIG. 1.

As shown in FIG. 2, the first-type semiconductor layer 120 is located on the substrate 110, the N-type doped region 130 comprises a first N-type doped region 131 and a second N-type doped region 132 serving as drain-source regions, which are respectively located at two sides of a vertical region of the gate structure 140, and are separated by the first-type semiconductor layer 120. Under a circumstance that a certain voltage is applied to the gate structure 140, the first N-type doped region 131 and the second N-type doped region 132 can be electrically connected together through the first-type semiconductor layer 120 located between the first N-type doped region 131 and the second N-type doped region 132, thus forming a conductive channel.

Figure 3:
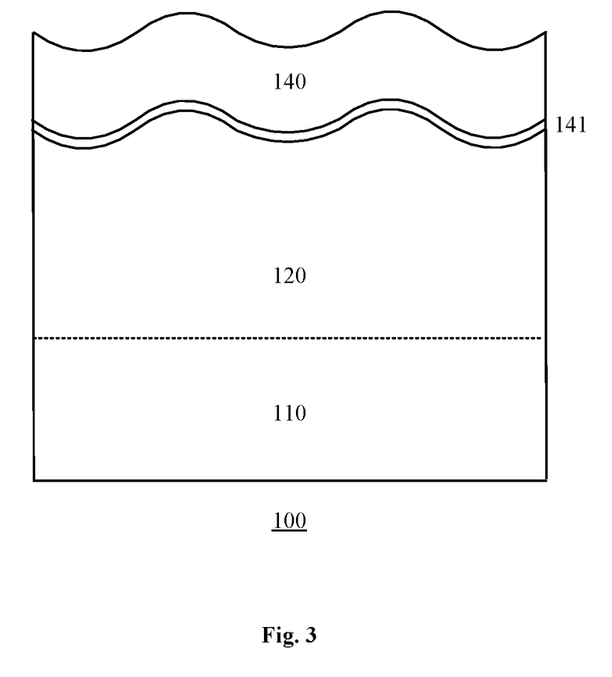
FIG. 3 shows a structural schematic view of a second vertical section of the semiconductor device shown in FIG. 1 according to an embodiment of the present disclosure.
Figure 4:
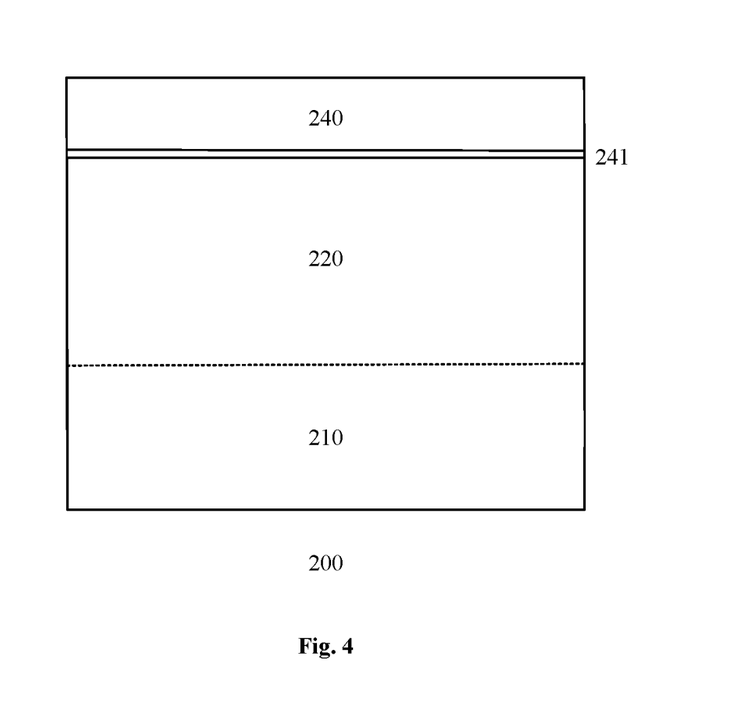
FIG. 4 shows a structural section view corresponding to the second vertical section shown in FIG. 3 of a conventional semiconductor device according to the prior art.

FIG. 3 shows a structural schematic view of a second vertical section of the semiconductor device shown in FIG. 1 according to an embodiment of the present disclosure. FIG. 4 shows a structural section view corresponding to the second vertical section shown in FIG. 3 of a conventional semiconductor device according to the prior art. It should be noted that the second vertical section corresponds to O-A-C plane at a location of the gate structure 140 shown in FIG. 1.

As shown in FIG. 4, the conventional semiconductor device 200 in the prior art comprises: a substrate 210, a first-type semiconductor layer 220 located on the substrate 210, and a gate structure 240 located on the first-type semiconductor layer 220. The gate structure 240 is a planar gate structure, comprising a gate oxide layer 241 and a polysilicon layer located on the gate oxide layer 241. Compared with the conventional semiconductor device 200 in FIG. 4, as shown in FIG. 3, according to an embodiment of the present disclosure, an upper surface of the first-type semiconductor layer 120 and the gate structure 140 each have an up-and-down wave shape. An effective width of the channel region of the semiconductor device 100 is a total length of wave lines, and is longer than the effective width of a channel region of the conventional semiconductor device 200. The gate structure 140 shown in FIG. 3 comprises a gate oxide layer 141 and a polysilicon layer located on the gate oxide layer 141.

Compared with the conventional semiconductor device 200, of which the effective width of the channel region is a straight length, along the width direction of the channel region, of the channel region, the semiconductor device 100 according to an embodiment of the present disclosure, which has a same size with the conventional semiconductor device 200, has the channel region with an effective width consistent with a total length of the wave lines, extending along the width direction of the channel region, of the channel region, thus effectively improving a current carrying capacity and reducing an on-state resistance of the semiconductor device 100.

FIG. 5-FIG. 9 respectively show structural schematic views of a vertical section of a semiconductor device in different stages of a manufacturing method of the semiconductor device according to an embodiment of the present disclosure.

Figure 5:
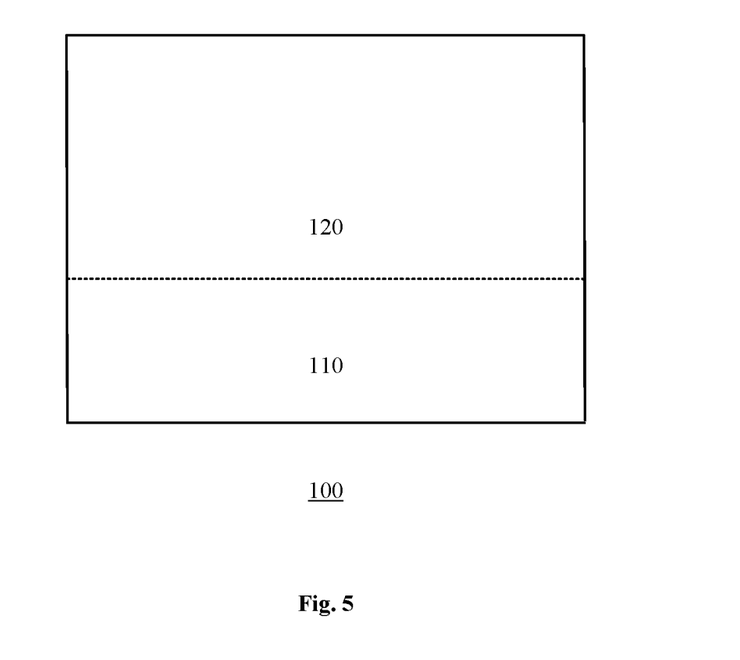
FIG. 5-FIG. 9 respectively show structural schematic views of a vertical section of a semiconductor device in different stages of a manufacturing method of the semiconductor device according to an embodiment of the present disclosure.
Figure 6:
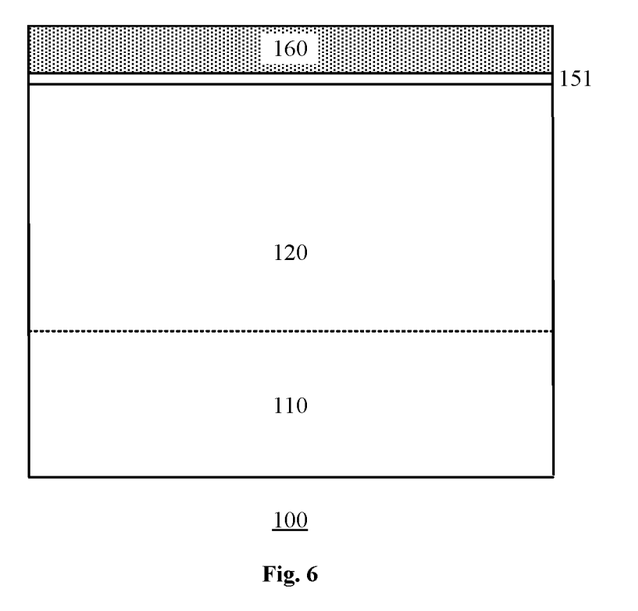
Figure 7:
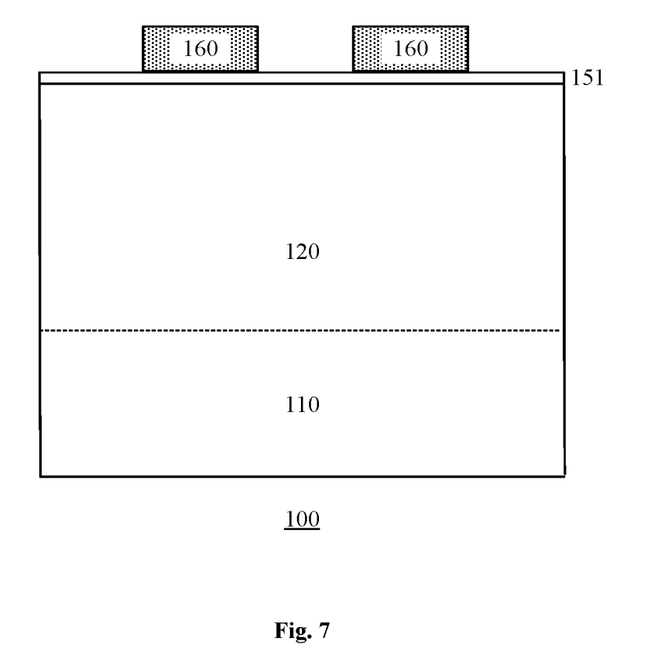
Figure 8:
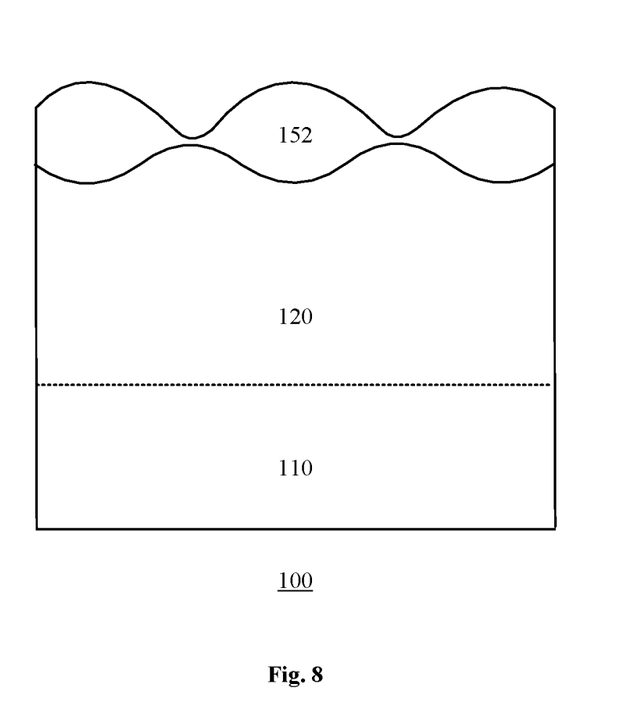
Figure 9:
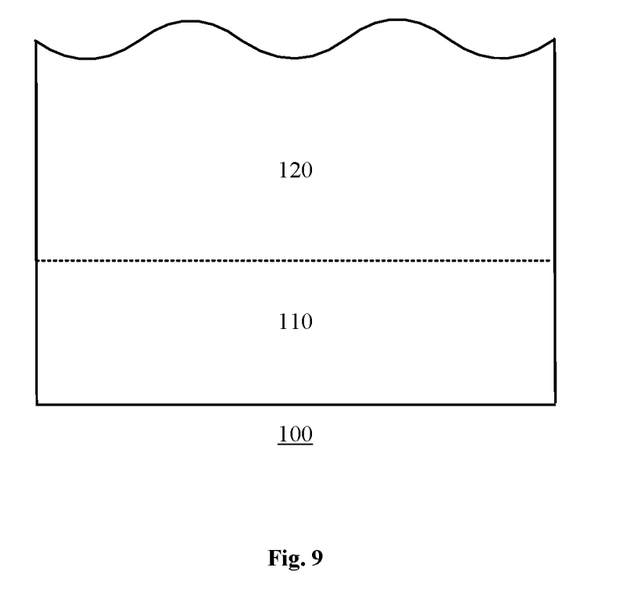

Referring to FIG. 5, FIG. 6. FIG. 7, FIG. 8 and FIG. 9, a first-type semiconductor layer 120 is formed on a substrate 110 by means of a traditional semiconductor manufacturing process, thus a structure shown in FIG. 5 is formed; then, a pad oxide layer 151 and a silicon nitride layer 160 are successively grown on the first-type semiconductor layer 120 by using a traditional semiconductor manufacturing process, thus a structure shown in FIG. 6 is formed; then, the silicon nitride layer 160 is separated into a plurality of uniform segments by an etching process which uses a photolithography mask layer as a mask, and a distribution direction of the plurality of uniform segments is consistent with a width direction of a channel region being formed in a subsequent process, thus a structure shown in FIG. 7 is formed; then, an oxide layer 152 is grown by use of a traditional thermal growth field oxygen process, and the silicon nitride layer 160 is removed, thus an up-and-down wave structure shown in FIG. 8 is formed; and then, the oxide layer 152 formed by means of the thermal growth field oxygen process is removed, thus a structure as shown in FIG. 9 is formed, and an upper surface of the first-type semiconductor layer 120 has an up-and-down wave shape following a consistent trend with the width direction of the channel region.

After the above-mentioned processes, traditional processes for forming gate oxide and polycrystalline silicon, steps of obtaining a gate structure having a wave shape, and implanting in drain and source regions can be further performed to form a structure (as shown in FIG. 1) of the semiconductor device 100 of an embodiment according to the present disclosure. Wherein, a manufacturing process for forming the gate structure, the drain and source regions may comprises: growing a gate oxide layer 141 on the first-type semiconductor layer 120; then depositing and etching a polysilicon layer on the gate oxide layer 141 to form the gate structure 140, wherein the channel region is a portion of the first-type semiconductor layer 120 located under the gate structure 140; then, by using the gate structure 140 as a mask, performing implantation in a self-aligned process to form the source region and the drain region, which are respectively located at two sides of the channel region.

In an embodiment of the present disclosure, the first-type semiconductor layer 120 is a well region, which is formed by an implantation process performed on the substrate 110. Then, subsequent process steps can be performed after the well region is formed. In another embodiment of the present disclosure, the well region can be formed by means of doping ion implantation process after the process of forming an up-and-down wave structure of the upper surface of the substrate 110. That is, the composition of the first-type semiconductor layer 120 shown in FIG. 5 is the same as that of the substrate 110, in other words, the first-type semiconductor layer 120 is an upper portion of the substrate 110. After the structure shown in FIG. 9 is formed, the well region is formed by implanting doping ion into the first-type semiconductor layer 120. If the well region is formed in the one embodiment of the present disclosure before the structure shown in FIG. 9 is formed, a lower surface of the well region can be relatively flat; if the well region is formed in the another embodiment of the present disclosure after the structure shown in FIG. 9 is formed, the lower surface of the well region can be conformal with the wavy upper surface. The process sequence of the steps to form the well region can be selected according to actual requirements. It is easy to understand that although the well region is formed by implantation according to the above-mentioned embodiments, other feasible traditional process, such as diffusion, can also be used to form the well region.

If the semiconductor device 100 is finally manufactured to be an NPN-type transistor, then the first-type semiconductor layer 120 is a P-type well region, and the doped regions located at two sides of the channel region are N-type doped regions. If the semiconductor device 100 is finally manufactured to be an LDMOS device, the doped regions located at two sides of the channel region are an N-type doped region and a P-type doped region, respectively.

In the process step of forming the structure shown in FIG. 7, the length of each of the plurality of segments and the interval distances between the plurality of segments of the silicon nitride layer 160 can be adjusted according to actual process requirements, so as to form a plurality of wave structures, which are located on the silicon surface and have different wavelengths and/or different peak-valley differences. That is, the formed wave structures can be non-uniform. A total effective length of each wave structure is related to the wavelength and the peak-valley difference of that wave structure, which are affected by the thickness of the pad oxide layer 151, the length and thickness of each of the plurality of segments and the interval distances between the plurality of segments of the silicon nitride layer 160.

According to the embodiments of the present disclosure, a key point of the manufacturing method of the semiconductor device 100 is to form an up-and-down wavy upper surface of the first-type semiconductor layer 120, so that the upper surface of the first-type semiconductor layer 120 can have a larger effective size when the device size is limited, and the channel region can have a longer effective width. Also, the up-and-down wavy upper surface of the first-type semiconductor layer 120 can be formed by use of a traditional thermal growth field oxygen method, in which only a new photolithography mask is additionally used for forming the plurality of segments to separating the silicon nitride layer 160, thus effectively improving the performance of the semiconductor device 100 with a reduced overall cost. The use of the traditional thermal growth field oxygen method effectively reduces process difficulty and process cost, and does not affect other process steps in a traditional semiconductor manufacturing process. Therefore, the above-described embodiments according to the present disclosure takes an NMOS device as an example, but it should be understood that the semiconductor device 100 in some embodiments of the present disclosure is not limited to an NMOS device, but can also be other devices, such as a P-type metal oxide semiconductor (PMOS) device or an LDMOS device, etc.

If an LDMOS device is a complementary metal oxide semiconductor (CMOS) device, an additional photolithography mask can be used to form an up-and-down wavy upper surface of a semiconductor layer in a whole LDMOS region of the LDMOS device, while a silicon nitride layer can be retained in other region of the LDMOS device, and no oxide layer is formed at intervals on the silicon surface in the other regions, and no up-and-down wavy upper silicon surface is formed in subsequent processes. When an LDMOS device with a drift region is manufactured, an additional photolithography mask can be used to form an up-and-down wavy silicon surface in a whole LDMOS region of the LDMOS device, or be used to form an up-and-down wavy silicon surface only in a channel region of the LDMOS device, which mainly improves an effective width of the channel region, and a process difference in between is to use different patterns of the photolithography mask.

For forming a wavy structure in a whole region, a wavy channel region can be formed as required, besides, a doped region, serving as a source region and/or a drain region, can also has a wave shape matched with the wavy channel region, thus improving the matching degree of the channel region with the source region and/or the drain region, and optimizing the performances, such as ensuring an uniformity of impurity implantation, optimizing a consistency of an on-state voltage of the channel region, and optimizing a depth requirement of impurity implantation. Due to the wavy surface of the channel region, if taking a horizontal level as a reference, impurity implantation depths in the doped region can be different, and the doped region designed to be matched with the wavy surface of the channel region may meet an implantation depth requirement in its whole region easily by performing a uniformed implantation process onto the whole region of the doped region, thus reducing a complexity of the implantation process and saving the process cost.

According to the embodiments of the present disclosure described above, these embodiments neither describe all the details in detail, nor limit the present disclosure to only the specific embodiments described. Obviously, according to the above description, many modifications and changes can be made. In order to better explain the principle and practical application of the present invention, the present specification selects and specifically describes these embodiments, so that the person skilled in the technical field can make good use of the present invention and the modification based on the present invention. The present invention is only limited by the claims, full scope and equivalents of the claims.

The invention claimed is:

1. A manufacturing method of a semiconductor device, wherein the manufacturing method comprises:
   successively forming a pad oxide layer and a silicon nitride layer on a substrate, which comprises a first-type semiconductor layer serving as a well region;
   etching the silicon nitride layer by use of a photolithography mask layer as a mask to separate the silicon nitride layer into a plurality of segments, wherein the plurality of segments of the silicon nitride layer has a distribution direction consistent with a width direction of a channel region of the semiconductor device;
   forming an oxide layer on the semiconductor device, which is obtained after the silicon nitride layer is etched, by using a thermal growth field oxygen process, and removing the silicon nitride layer and the oxide layer;
   forming a gate structure on the first-type semiconductor layer after removing the photolithography mask layer, the oxide layer, and the silicon nitride layer, wherein the gate structure comprises a gate oxide layer and a polysilicon layer; and
   forming a second-type doped region on the semiconductor device, and forming the channel region in the first-type semiconductor layer, wherein the channel region at least separates the second-type doped region into a first second-type doped region and a second second-type doped region.

2. The manufacturing method according to claim 1, wherein the plurality of segments of the silicon nitride layer are only distributed on a portion of the first-type semiconductor layer, and the portion is matched with the channel region.

3. The manufacturing method according to claim 1, wherein the plurality of segments of the silicon nitride layer are uniformly distributed.

4. The manufacturing method according to claim 1, wherein a size of each of the plurality of segments of the silicon nitride layer is adjustable, so as to make a wavelength and a peak-valley difference of a corresponding wave structure of the first-type semiconductor layer adjustable.

5. The manufacturing method according to claim 1, wherein interval distances among the plurality of segments of the silicon nitride layer are adjustable, so as to make a wavelength and a peak-valley difference of a corresponding wave structure of the first-type semiconductor layer adjustable.

6. The manufacturing method according to claim 1, wherein a thickness of the pad oxide layer is adjustable, so as to make a wavelength and a peak-valley difference of a corresponding wave structure of the first-type semiconductor layer adjustable.

7. The manufacturing method according to claim 1, wherein a well region is formed by implanting doping impurity into the first-type semiconductor layer, after the photolithography mask layer, the oxide layer, and the silicon nitride layer are removed.

8. The manufacturing method according to claim 1, wherein before successively forming the pad oxide layer and the silicon nitride layer on the substrate, the method further comprises:

forming a well region by implanting doping impurity into the first-type semiconductor layer.

* * * * *